United States Patent
Shih et al.

(10) Patent No.: US 11,282,742 B2
(45) Date of Patent: Mar. 22, 2022

(54) SEMICONDUCTOR DEVICE WITH MULTI-LAYER ETCH STOP STRUCTURE AND METHOD FOR FORMING THE SAME

(71) Applicant: Taiwan Semiconductor Manufacturing Co., Ltd., Hsinchu (TW)

(72) Inventors: Po-Cheng Shih, Hsin Chiu (TW); Tze-Liang Lee, Hsinchu (TW); Jen-Hung Wang, Hsinchu County (TW); Yu-Kai Lin, Changhua County (TW); Su-Jen Sung, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/655,961

(22) Filed: Oct. 17, 2019

(65) Prior Publication Data
US 2021/0118728 A1   Apr. 22, 2021

(51) Int. Cl.
  *H01L 21/768* (2006.01)
  *H01L 23/532* (2006.01)
  *H01L 23/522* (2006.01)
  *H01L 21/02* (2006.01)
(52) U.S. Cl.
  CPC .. *H01L 21/76832* (2013.01); *H01L 21/76802* (2013.01); *H01L 21/76834* (2013.01); *H01L 23/53238* (2013.01); *H01L 23/53295* (2013.01); *H01L 21/0228* (2013.01); *H01L 21/0234* (2013.01); *H01L 21/02126* (2013.01); *H01L 21/02167* (2013.01); *H01L 21/02178* (2013.01); *H01L 21/02274* (2013.01); *H01L 21/02315* (2013.01); *H01L 23/5226* (2013.01)
(58) Field of Classification Search
  None
  See application file for complete search history.

(56) References Cited

U.S. PATENT DOCUMENTS

| | | | | |
|---|---|---|---|---|
| 9,515,021 B1* | 12/2016 | Chen | | H01L 21/76802 |
| 2010/0081275 A1* | 4/2010 | Ishizaka | | H01L 21/76883 |
| | | | | 438/653 |
| 2012/0223413 A1* | 9/2012 | Lindert | | H01L 27/10894 |
| | | | | 257/532 |
| 2016/0111325 A1* | 4/2016 | JangJian | | H01L 21/76877 |
| | | | | 257/774 |
| 2016/0133512 A1* | 5/2016 | Lee | | H01L 21/32134 |
| | | | | 438/666 |

(Continued)

*Primary Examiner* — Nishath Yasmeen
(74) *Attorney, Agent, or Firm* — Birch, Stewart, Kolasch & Birch, LLP

(57) ABSTRACT

A semiconductor device structure is provided. The structure includes a conductive feature formed in an insulating layer. The structure also includes a first metal-containing dielectric layer formed over the insulating layer and covering the top surface of the conductive feature. The structure further includes a silicon-containing dielectric layer formed over the first metal-containing dielectric layer. In addition, the structure includes a second metal-containing dielectric layer formed over the silicon-containing dielectric layer. The second metal-containing dielectric layer includes a material that is different than the material of the first metal-containing dielectric layer.

20 Claims, 5 Drawing Sheets

(56) References Cited

U.S. PATENT DOCUMENTS

2016/0163589 A1* 6/2016 Lee .................. H01L 21/76849
438/626
2017/0194242 A1* 7/2017 Huang .............. H01L 23/53295
2019/0333807 A1* 10/2019 Tung .................. H01L 23/5329

* cited by examiner

SEMICONDUCTOR DEVICE WITH MULTI-LAYER ETCH STOP STRUCTURE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of processing and manufacturing ICs. For example, copper-based interconnect structures typically implemented in multilayer interconnect (MLI) features have presented performance, yield, and cost challenges as MLI structures become more compact with ever-shrinking IC feature size.

For example, copper-based interconnect structures thus formed have been observed to exhibit copper pits or copper hillock therein due to subsequent fabrication of passivation layer over the interconnect structures. Therefore, it is a challenge to form reliable interconnect structures for prevention of yield loss.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
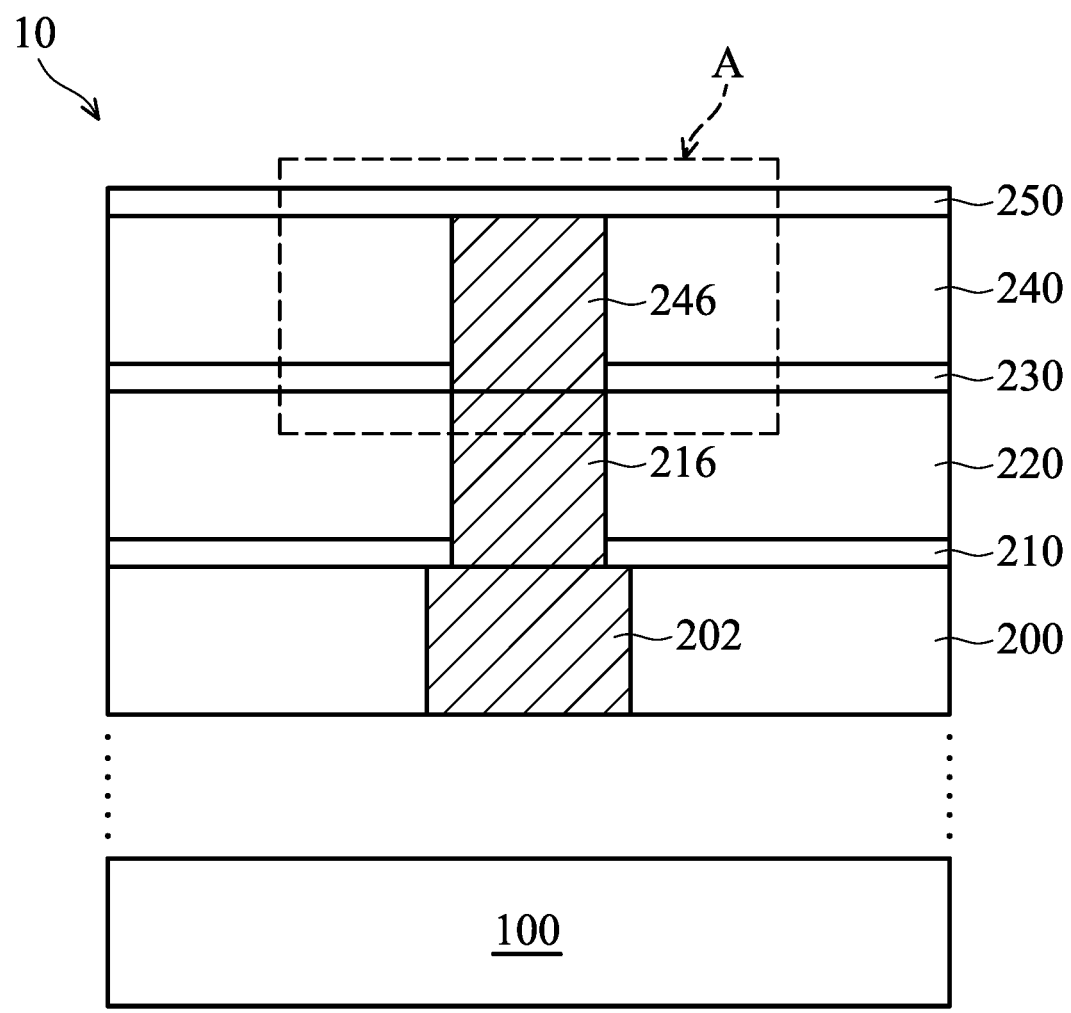
FIG. 1 is a schematic of an intermediate semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, so that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another elements or features as illustrated in the figures. The spatially relative terms are intended to encompass different orientations of the device in use or operation in addition to the orientation depicted in the figures. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 Å" encompasses the dimension range from 4.5 Å to 5.5 Å. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Semiconductor manufacturing process flow is typically divided into three categories: front-end-of-line (FEOL), middle-end-of-line (MEOL), and back-end-of-line (BEOL). FEOL generally encompasses processes related to fabricating semiconductor devices, such as transistors. For example, FEOL processes may include forming isolation features, gate structures, and source and drain features (or referred to as source/drain regions). MEOL generally encompasses processes related to fabricating contacts to conductive structure (or conductive regions) of the semiconductor devices, such as contacts to the gate structures and/or the source/drain regions. BEOL generally encompasses processes related to fabricating interconnect structures that interconnect conductive structures/features fabricated by FEOL processes (referred to herein as FEOL features or structures) and MEOL processes (referred to herein as MEOL features or structures), thereby enabling operation of the semiconductor devices. For example, BEOL processes may include forming multilayer interconnect features that facilitate operation of the semiconductor devices. The embodiments explore a method of forming semiconductor device structure including interconnect structures and etch stop structures during BEOL processes for improved semiconductor device performance and reduced yield loss.

Embodiments of a semiconductor device structure and a method for forming a semiconductor device structure are provided. FIG. 1 is a schematic of an intermediate semiconductor device structure in accordance with some embodiments. As shown in FIG. 1, semiconductor device structure 10 may be included in a microprocessor, a memory, and/or other integrated circuit device. In some implementations, semiconductor device structure 10 is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high-frequency transistors, and other suitable components. The transistors may be planar transistors or multi-gate transistors, such as fin-like FETs (FinFETs). FIG. 1 has been simplified for the sake of clarity to better understand the inventive concepts of the embodiments. Additional features may be added in semiconductor device structure 10, and some of the features described below may be replaced, modified, or eliminated in other embodiments of semiconductor device structure 10.

The semiconductor device structure 10 includes a semiconductor substrate 100, which may be, for example, a part of a wafer. In some embodiments, the semiconductor substrate 100 includes a semiconductor material (e.g., silicon). In some other embodiments, the semiconductor substrate 100 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. Alternatively, the semiconductor substrate 100 is a semiconductor on insulator (SOI).

In some embodiments, the semiconductor substrate 100 includes silicon, silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A person of ordinary skill in the art will readily understand other methods of forming the fin, which are contemplated within the scope of some embodiments.

The semiconductor substrate 100 may include various doped regions (not shown) depending on the requirements for the design of the semiconductor device structure 10. In some embodiments, the semiconductor substrate 100 includes p-type doped regions (for example, p-type wells) doped with p-type dopants, such as boron (for example, $BF_2$), indium, other p-type dopant, or a combination thereof. In some embodiments, the semiconductor substrate 100 includes n-type doped regions (for example, n-type wells) doped with n-type dopants, such as phosphorus, arsenic, another n-type dopant, or a combination thereof. In some other embodiments, the semiconductor substrate 100 includes doped regions formed with a combination of p-type dopants and n-type dopants. The various doped regions may be formed directly on and/or in the semiconductor substrate 100, for example, providing a p-well structure, an n-well structure, a dual-well structure, a raised structure, or a combination thereof.

An ion implantation process, a diffusion process, another suitable doping process, or a combination thereof may be performed to form the various doped regions. In some examples, semiconductor substrate 100 may be a three-dimensional fin structure (i.e., semiconductor substrate 100 may be alternatively referred to as fin structure that includes one or more semiconductor materials provided herein, and may further include doped regions as discussed above.

One or more isolation features (not shown) are formed over and/or in the semiconductor substrate 100 to isolate various regions, including the various device regions of the semiconductor device structure 10. For example, isolation features define and electrically isolate active device regions and/or passive device regions from each other. Isolation features include silicon oxide, silicon nitride, silicon oxynitride, another suitable isolation material, or a combination thereof. Isolation features may include different structures, such as shallow trench isolation (STI) structures, deep trench isolation (DTI) structures, and/or local oxidation of silicon (LOCOS) structures. In some embodiments, isolation features include STI features. For example, the STI features may be formed by etching a trench in the semiconductor substrate 100 (for example, by using a dry etch process or wet etch process) and filling the trench with insulating material by using, for example, a chemical vapor deposition (CVD) process or a spin-on glass process). The insulating material may be made of a dielectric material, such as silicon oxide, fluoride-doped silicate glass (FSG), a low-k dielectric material, or another suitable insulating material.

A chemical mechanical polishing (CMP) process may be performed to remove excessive insulating material and/or planarize the top surface of the isolation features. In some embodiments, the STI features include a multi-layer structure that fills the trenches, such as a silicon oxide layer disposed over a liner layer that is made of silicon oxide, silicon nitride, silicon oxynitride, silicon carbide (SiC), or a combination thereof.

In some embodiments, the semiconductor device structure further includes a gate structure (not shown) positioned over the semiconductor substrate 100. In some embodiments, the gate structure may include a gate dielectric layer, a gate electrode layer, gate spacers, and/or one or more additional layers (not shown). For example, the gate structure may include an interfacial layer (not shown), a gate dielectric layer and a gate electrode layer. The gate electrode layer may include one or more work function layers and a fill metal layer. In some embodiments, the interfacial layer may include a dielectric material such as silicon oxide layer ($SiO_2$) or silicon oxynitride (SiON). The gate dielectric layer may be made of silicon dioxide or another suitable dielectric material. Alternatively, the gate dielectric layer 106 may include a high-k dielectric layer such as $HfO_2$, $TiO_2$, $HfZrO$, $Ta_2O_3$, $HfSiO_4$, $ZrO_2$, $ZrSiO_2$, or a combination thereof. An exemplary p-type work function metal may include TiN, TaN, Ru, Mo, Al, WN, $ZrSi_2$, $MoSi_2$, $TaSi_2$, $NiSi_2$, WN, or a combination thereof. An exemplary n-type work function metal may include Ti, Ag, TaAl, TaAlC, TiAlN, TaC, TaCN, TaSiN, Mn, Zr, or a combination thereof. The fill metal layer may be made of a metal-containing material such as TiN, TaN, TaC, Co, Ru, Al, a combination thereof, or multi-layers thereof.

The gate structure may be formed by deposition processes, lithography processes, etching processes, or other suitable processes. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, another suitable method, or a combination thereof.

The lithography patterning processes include resist coating (for example, spin-on coating), soft baking, mask aligning, exposure, post-exposure baking, developing the resist, rinsing, drying (for example, hard baking), another suitable process, or a combination thereof. Alternatively, the lithography exposure process is assisted, implemented, or replaced by other methods, such as maskless lithography, electron-beam writing, or ion-beam writing. The etching processes include dry etching processes, wet etching processes, other etching processes, or a combination thereof.

The gate electrode layer may be fabricated according to a gate-last process, a gate-first process, or a hybrid gate-last/gate-first process. For example, in the gate-last process, the gate structure may include a dummy gate electrode layer that is subsequently replaced with metal gate electrode layer. The dummy gate electrode layer includes, for example, an interfacial layer (including, for example, silicon oxide) and a dummy gate bulk layer (including, for example, polysilicon). The dummy gate electrode layer is removed, thereby forming openings (trenches) in which a metal gate electrode layer is formed.

The gate spacers are disposed adjacent to (for example, along the sidewalls of) the respective metal gate electrode layer. The gate spacers are formed using any suitable process and include a dielectric material. The dielectric material may include silicon, oxygen, carbon, nitrogen, another suitable material, or a combination thereof (for example, silicon oxide, silicon nitride, silicon oxynitride, or silicon carbide). For example, a dielectric layer containing silicon and nitrogen, such as a silicon nitride layer, may be deposited over the semiconductor substrate 100 and subsequently anisotropically etched to form the gate spacers. In some embodiments, the gate spacers include a multi-layer structure, such as a first dielectric layer that includes silicon nitride and a second dielectric layer that includes silicon oxide. Implantation, diffusion, and/or annealing processes may be performed to form lightly doped source and drain (LDD) features and/or heavily doped source and drain (HDD) features in the semiconductor substrate 100 before and/or after forming the gate spacers, depending on the requirements on the design of the semiconductor device structure 10.

In some embodiments, a multilayer interconnect (MLI) structure is disposed over the semiconductor substrate 100. The MLI structure electrically couples various devices (for example, transistors, resistors, capacitors, and/or inductors) and/or components (for example, gate structures and/or source/drain features) in the semiconductor device structure 10, so that the various devices and components may operate as designed. The MLI structure may include a combination of insulating layers, dielectric layers, and conductive features configured to form various interconnect structures. The conductive features are configured to form vertical interconnect structures, such as contacts and/or vias, and/or horizontal interconnect structures, such as conductive lines. Vertical interconnect structures typically connect horizontal interconnect structures or other vertical interconnect structures in different layers (or different planes) of The MLI structure. The interconnect structures are configured to route signals between the devices and/or the components in the semiconductor device structure 10 and/or distribute signals (for example, clock signals, voltage signals, and/or ground signals) to the devices and/or the components in the semiconductor device structure 10. It should be noted that although The MLI structure is depicted in FIG. 1 with a given number of dielectric layers and conductive features, the MLI structure in the embodiments may have more or fewer dielectric layers and conductive features, depending on the design requirements.

In some embodiments, the MLI structure includes one or more insulating/dielectric layers, such as an insulating layer 200 (which is also referred to as an interlayer dielectric layer (ILD-1)) formed over the semiconductor substrate 100, an insulating layer 220 (which is also referred to as an ILD-2) formed over the insulating layer 200, and an insulating layer 240 (which is also referred to as an ILD-3) formed over the insulating layer 220, as shown in FIG. 1.

In some embodiments, the insulating layers 200, 220, and 240 are alternatively referred to as inter-metal dielectric (IMD) layers. insulating layers 200, 220, and 240 may be made of silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, extra low-k dielectric material, another suitable dielectric material, or a combination thereof. For example, the insulating layers 200, 220, and 240 are dielectric layers that include an extra low-k dielectric material (generally referred to as extra low-k dielectric layers). Moreover, the insulating layers 200, 220, and 240 may include a multilayer structure having multiple dielectric materials.

In some embodiments, the MLI structure further includes one or more etch stop structures disposed over the semiconductor substrate 100, such as an etch stop structure 210 formed between the insulating layer 200 and the insulating layer 220, an etch stop structure 230 formed between the insulating layer 220 and the insulating layer 240, and an etch stop structure 250 formed over the insulating layer 240. The etch stop structures 210, 230, and 250 are made of materials that are different from those of the insulating layers 200, 220, and 240.

The etch stop structures 210, 230, and 250 and/or the insulating layers 200, 220, and 240 may be formed over the semiconductor substrate 100 by a deposition process, such as CVD, PVD, ALD, PECVD, HDPCVD, MOCVD, RPCVD, LPCVD, ALCVD, APCVD, spin-on dielectric, flowable CVD (FCVD), another suitable method, or a combination thereof. After the deposition of the insulating layers 200, 220, and 240 and/or the etch stop structures 210, 230, and 250, a CMP process and/or other planarization process may be performed, so that the insulating layers 200, 220, and 240 and/or the etch stop structures 210, 230, and 250 have substantially planar surfaces.

In some embodiments, the MLI structure further includes at least one contact 202, at least one via 216, and at least one via 246 formed in the insulating layers 200, 220, and 240, respectively, to form interconnect structures.

The contact 202 (which is also referred to as a local interconnect or local contact) is electrically coupled to and/or physically coupled to devices or components, or other conductive features of the MLI structure. For example, the contact 202 is electrically coupled to a gate structure (not shown), such as a poly gate structure or a metal gate structure. In some embodiments, the contact 202 extends through the insulating layer 200. In some other embodiments, the contact 202 is electrically coupled to a conductive region (not shown), such as a source/drain region. In some embodiments, the contact 202 is formed on the gate structure or the conductive region, so that the contact 202 connects the gate structure or the conductive region to the via 216. Moreover, the via 216 extends through the insulating layer 220 and the etch stop structure 210. In some embodiments, the contact 202 is an MEOL conductive feature that interconnects an FEOL conductive feature (e.g., the gate structure and/or the source/drain region) to BEOL conductive features (e.g., the via 216), thereby electrically and/or physically coupling the FEOL conductive feature to the BEOL conductive feature.

In some embodiments, the Via 216 and the via 246 are electrically and/or physically coupled to each other. For example, the via 216 is formed over the contact 202, so that the via 216 connects the contact 202. In addition, the via 246 is formed over the via 216 and is covered by the etch stop structure 250, so that the via 246 connects to the via 216. In some embodiments, the via 246 extends through the insulating layer 240 and the etch stop structure 230. In some embodiments, the via 246 is also a BEOL conductive feature that interconnects BEOL conductive features in a different insulating layer (i.e., an ILD layer) to one another, thereby electrically and/or physically coupling the BEOL conductive features of the semiconductor device structure 10. The contact 202, the via 216, and the via 246 may include any suitable conductive material, such as Cu, Ta, Ti, Al, TaN, TiN, another suitable conductive material, or a combination thereof. The contact 202, the via 216, and the via 246 may be formed by PVD, CVD, ALD, electroplating, electroless deposition, or another suitable deposition process, or a combination thereof.

In some embodiments, a passivation structure is formed over the uppermost insulating layer (i.e., the uppermost ILD/IMD layer). In those cases, in order to improve device performance, an annealing process is performed in reduction gas (e.g., hydrogen ($H_2$) gas) ambient during the formation of the passivation structure. However, after such an annealing process is performed, hydrogen atoms may pass from the ILD layers and the etch stop structures into the conductive features (which may include copper formed in the ILD layers). As a result, pits are formed in the conductive features, reducing their reliability. On the other hand, the deposition temperature for the etch stop structures may be high (e.g., equal to greater than 400° C.), so that a hillock is formed in the conductive features during the formation of the etch stop structures. As a result, the reliability of the conductive features is reduced further, thereby causing significant yield loss.

To address these challenges, semiconductor manufacturers are seeking to improve methods of forming interconnect features with reduced pits and hillocks, thereby increasing the reliability of the MLI structure while improving device performance.

Figure 2:
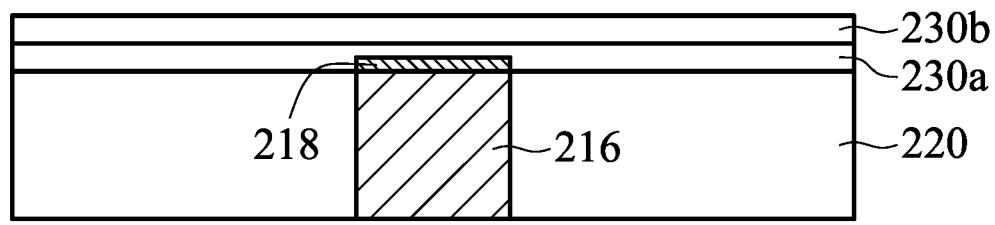
FIGS. 2, 3, 4, 5, 6, 7, and 8 are enlarged cross-sectional views of various intermediate stages showing a method of forming a portion of the semiconductor device structure of FIG. 1 that includes interconnect structures and etch stop structures in accordance with some embodiments.

FIGS. 2, 3, 4, 5, 6, 7, and 8 are enlarged cross-sectional views of various intermediate stages showing a method of forming a portion of the semiconductor device structure 10 of FIG. 1 that includes the interconnect structures (e.g., the vias 216 and 246) and the multi-layer etch stop structures (e.g., the etch stop structures 230 and 250) in accordance with some embodiments. As shown in FIG. 2, an insulating layer 220 having a conductive feature (i.e., a via 216) formed therein, in accordance with some embodiments. In some embodiments, the insulating layer 220 is formed over a semiconductor substrate 100 (not shown and as indicated in FIG. 1). The via 216 (conductive feature) is a BEOL feature and includes a conductive layer. The conductive layer may include any suitable conductive material, such as Cu, W, Ta, Ti, Al, TaN, TiN, another suitable conductive material, or a combination thereof. Though not depicted, in some implementations, the via 216 may further include other conductive material layers, such as a barrier liner, an adhesion layer, another suitable material layer, or a combination thereof. The via 216 may be formed by any suitable deposition process (for example, PVD, CVD, ALD, electroplating, electroless deposition, or another suitable deposition process, or a combination thereof) and/or annealing process.

Moreover, the dielectric layer 220 may be an ILD layer (such as an extra low-k dielectric layer) and be formed by any suitable deposition process (for example, CVD, PECVD, spin-on dielectric, another suitable process, or a combination thereof).

Afterwards, a conductive capping layer 218 is selectively deposited to cover the via 216 in accordance with some embodiments. In some embodiments, the conductive capping layer 218 is made of cobalt. In those cases, the conductive capping layer 218 may be formed by any suitable deposition process (for example, PVD, CVD, ALD, or another suitable deposition process). Since the adhesion between the cobalt material and the copper material is better than the adhesion between the cobalt material and the low-k dielectric material, the conductive capping layer 218 (e.g., the cobalt layer) is selectively deposited on the underlying copper via 216.

Figure 3:
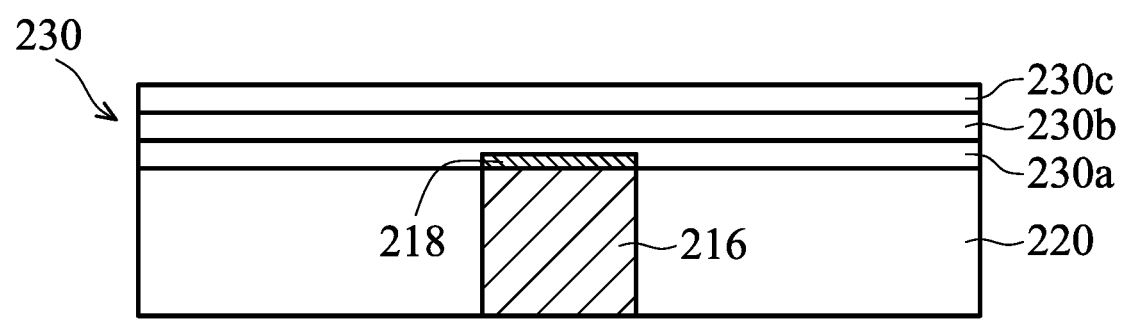

After the conductive capping layer 218 is formed, an etch stop structure 230 is formed over the insulating layer 220 and the conductive capping layer 218, as shown in FIGS. 2 and 3 in accordance with some embodiments. More specifically, in some embodiments, a first metal-containing dielectric layer 230a is formed over the insulating layer 220 and coves the top surface of the via 216 having the conductive capping layer 218 thereon. Afterward, a silicon-containing dielectric layer 230b is formed over and in direct contact with the first metal-containing dielectric layer 230a, as shown in FIG. 2 in accordance with some embodiments. In addition, a second metal-containing dielectric layer 230c is formed over and in direct contact with the silicon-containing dielectric layer 230b, as shown in FIG. 3 in accordance with some embodiments. In some embodiments, the second metal-containing dielectric layer 230c is made of a different material different from a material of the first metal-containing dielectric layer 230a. The first metal-containing dielectric layer 230a, the silicon-containing dielectric layer 230b, and the second metal-containing dielectric layer 230c form a multi-layer etch stop structure (i.e., the etch stop structure 230).

In some embodiments, the first metal-containing dielectric layer 230a includes metal, such as aluminum, zirconium, or Yttrium. Moreover, the first metal-containing dielectric layer 230a further includes nitrogen and oxygen. In those cases, the first metal-containing dielectric layer 230a is referred to as a metal-containing oxynitride layer. The first metal-containing dielectric layer 230a is made of an aluminum nitride layer, for example. In some embodiments, the metal content in the first metal-containing dielectric layer 230a is in a range from about 0.5 at % to about 70 at %. Moreover, the nitrogen content in the first metal-containing dielectric layer 230a is in a range from about 0.5 at % to about 60 at %.

The first metal-containing dielectric layer 230a may serve as a diffusion barrier layer for the adjacent conductive features. Therefore, the first metal-containing dielectric layer 230a has a suitable thickness for preventing the metal atoms in the adjacent conductive features from diffusing into the insulating layer adjacent to the conductive features while leading to reduction in the overall RC delay of the semiconductor device. In some embodiments, the first metal-containing dielectric layer 230a has a thickness in a range from about 3 Å to about 100 Å. In addition, the nitrogen in the first metal-containing dielectric layer 230a may react with the cobalt in the conductive capping layer 218, so as to form Co—N bonds. Those Co—N bonds form a protection to block hydrogen atoms from the mentioned annealing process that is performed in a reduction gas (e.g., hydrogen ($H_2$) gas) ambient, so that pits in the via 216 can be effectively reduced or eliminated.

The first metal-containing dielectric layer 230a may be formed by performing a soaking process, a pre-plasma treatment, a deposition process, and a post-plasma treatment. More specifically, the soaking process is performed using helium (He) as a process gas at a temperature in a range from about 320° C. to about 350° C. for about 10 sec to about 20 sec. The pre-plasma treatment is performed using $N_2$, $NH_3$, or a combination thereof as a process gas with high-frequency (HF) power at a temperature in a range from about 320° C. to about 350° C. for about 10 sec to about 20 sec. The deposition process (such as a thermal ALD process) is performed using trimethylaluminum (TMA) and $NH_3$ as process gases at a temperature in a range from about 320° C. to about 350° C. The post-plasma treatment is performed using $N_2$, $NH_3$, or a combination thereof as a process gas with high-frequency (HF) power and low-frequency (LF) power at a temperature in a range from about 320° C. to about 350° C. for about 10 sec to about 20 sec. Since the temperature for the process of forming the first metal-containing dielectric layer 230a is lower than 400° C., the formation of a hillock on the via 216 that is made of copper can be eliminated or mitigated.

In some embodiments, the silicon-containing dielectric layer 230b is made of SiCO with a thickness in a range from about 5 Å to about 150 Å. In those cases, the silicon content in the silicon-containing dielectric layer 230b is in a range from about 35 at % to about 60 at %. Moreover, the carbon content in the silicon-containing dielectric layer 230b is in a range from about 3 at % to about 30 at %. In addition, the oxygen content in the first metal-containing dielectric layer 230a is in a range from about 10 at % to about 65 at %. The silicon-containing dielectric layer 230b serves as a protection layer for protecting the underlying first metal-containing dielectric layer 230a from damage due to moisture.

In order to form such a protection layer, in some embodiments, the silicon-containing dielectric layer 230b made of SiCO is formed by an in-situ deposition process (e.g., a PECVD process) using tetramethylsilane (4MS) and $CO_2$ as process gases at a temperature in a range from about 350° C. to about 400° C. Namely, the silicon-containing dielectric layer 230b and the underlying first metal-containing dielectric layer 230a are formed with the same deposition tool and there is no air breaking during the formation of those layers 230a and 230b.

During the formation of the silicon-containing dielectric layer 230b, oxygen from the process gas (e.g., $CO_2$) may react with the underlying first metal-containing dielectric layer 230a, so that the first metal-containing dielectric layer 230a made of the aluminum nitride layer becomes an aluminum oxynitride layer. The oxygen content in the first metal-containing dielectric layer 230a may be in a range from about 2 at % to about 40 at %.

In some other embodiments, the silicon-containing dielectric layer 230b is made of SiCN. In those cases, the silicon content in the silicon-containing dielectric layer 230b is in a range from about 35 at % to about 60 at %. Moreover, the carbon content in the silicon-containing dielectric layer 230b is in a range from about 3 at % to about 30 at %. In addition, the nitrogen content in the first metal-containing dielectric layer 230a is in a range from about 10 at % to about 65 at %. Since the silicon-containing dielectric layer 230b is free of oxygen, the first metal-containing dielectric layer 230a made of the aluminum nitride layer does not become an aluminum oxynitride layer.

After the silicon-containing dielectric layer 230b is formed, a second metal-containing dielectric layer 230c is formed over the silicon-containing dielectric layer 230b. In some embodiments, the second metal-containing dielectric layer 230c includes metal, such as aluminum, zirconium, Yttrium, or a combination thereof. Moreover, the second metal-containing dielectric layer 230c further includes oxygen. In those cases, the second metal-containing dielectric layer 230c is referred to as a metal-containing oxide layer. The second metal-containing dielectric layer 230c is made of an aluminum oxide ($AlO_x$) layer, for example. In some embodiments, the metal content in the layer is in a range from about 0.5 at % to about 90 at %. Moreover, the oxygen content in the layer is in a range from about 10 at % to about 99.5 at %. Alternatively, the second metal-containing dielectric layer 230c includes metal, such as aluminum, and is doped with a metal dopant (e.g., zirconium or Yttrium). In those cases, the content of the metal dopant in the second metal-containing dielectric layer 230c is in a range from about 0.01 at % to about 20 at %.

The second metal-containing dielectric layer 230c is used to increase the thickness of the etch stop structure 230 while leading to reduction in the overall RC delay of the semiconductor device. In some embodiments, the second metal-containing dielectric layer 230c has a thickness in a range from about 3 Å to about 100 Å.

The second metal-containing dielectric layer 230c may be formed by performing a soaking process, a pre-plasma treatment, and a deposition process. More specifically, the soaking process is performed using helium (He) as a process gas at a temperature in a range from about 350° C. to about 400° C. for about 10 sec to about 20 sec. The pre-plasma treatment is performed using $N_2$, $NH_3$, or a combination thereof as a process gas with high-frequency (HF) power at a temperature in a range from about 350° C. to about 400° C. for about 10 sec to about 20 sec. The deposition process (such as a thermal ALD process) is performed using trimethylaluminum (TMA) and alcohol as process gases at a temperature in a range from about 350° C. to about 400° C.

Although the etch stop structure 210 (shown in FIG. 1) is not depicted in FIG. 3, the etch stop structure 210 may be a multi-layer etch stop structure that is the same as the etch stop structure 230. Namely, the material and the method that are used for the etch stop structure 210 are the same as or similar to those of the etch stop structure 230 as depicted and described in FIGS. 1 and 2.

Figure 4:
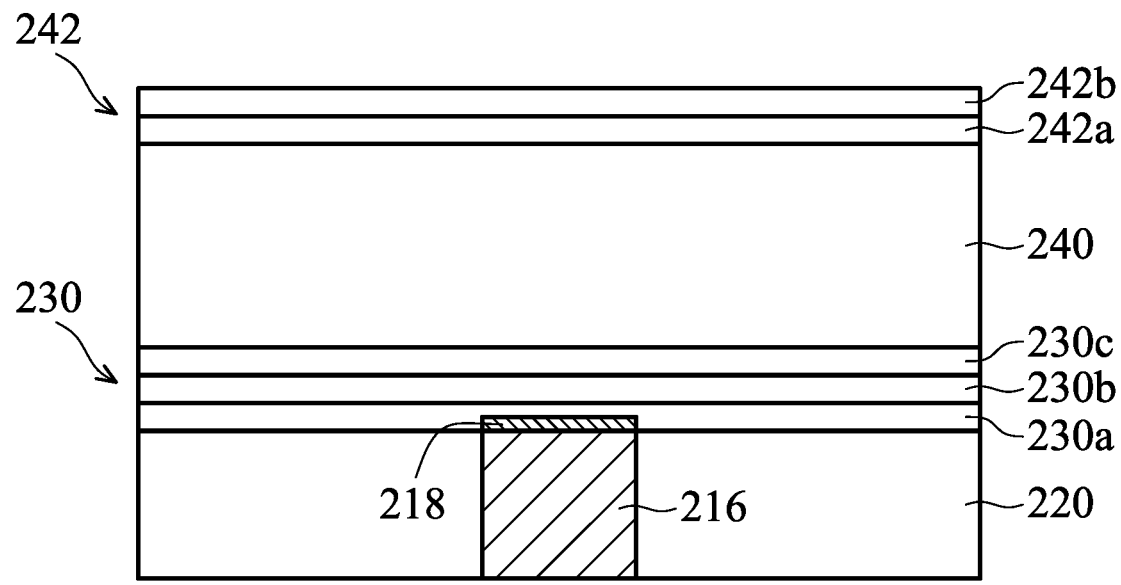

After the formation of the etch stop structure 230, an insulating layer 240 with a multi-layer masking structure 242 are successively formed over the etch stop structure 230, as shown in FIG. 4 in accordance with some embodiments. In some embodiments, the material and the method that are used for the insulating layer 240 are the same as or similar to those of the insulating layer 220 as depicted and described in FIGS. 1 and 2. Afterward, the multi-layer masking structure 242 is formed over the insulating layer 240. In some embodiments, the multi-layer masking structure 242 at least includes a first masking layer 242a and a second masking layer 242b. The first masking layer 242a includes a material having a different etching characteristics than the material of the second masking layer 242b. For example, the first masking layer 242a is made of a dielectric material, such as TEOS oxide, and is formed by CVD, PECVD, FCVD, the like, or a combination thereof. In addition, the second masking layer 242b includes a metal material, such as W, TiN, or carbon-doped tungsten. In some other embodiments, the multi-layer masking structure 242 includes more than two masking layers.

Figure 5:
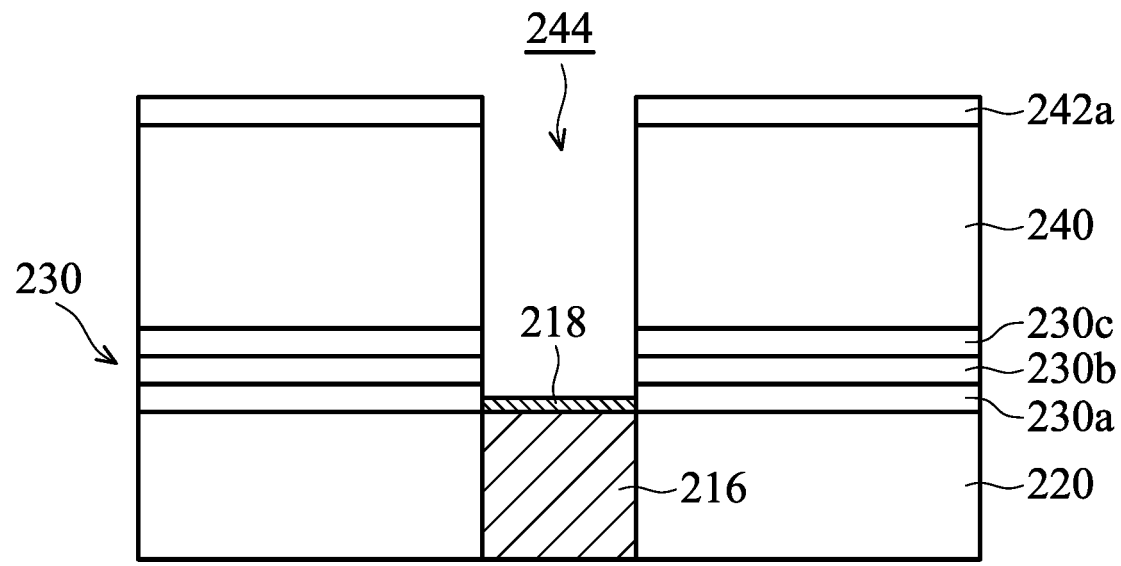

After the multi-layer masking structure 242 is formed, the multi-layer masking structure 242, the insulating layer 240 and the etch stop structure 230 are successively patterned as shown in FIG. 5 in accordance with some embodiments. In some embodiments, a patterned multi-layer masking structure including the first masking layer 242a and the second masking layer 242b (not show) is formed over the insulating layer 240 by lithography processes and/or etching processes. Afterwards, the insulating layer 240 and the etch stop structure 230 are successively etched using the patterned multi-layer masking structure as an etch mask, so as to form an opening 244 (e.g., a via hole) extending through the insulating layer 240 and the etch stop structure 230 and expose the conductive capping layer 218 via the opening 244. In some embodiments, the second masking layer 242b is entirely removed from the patterned multi-layer masking structure during the formation of the opening 244, so that the first masking layer 242a is left over the insulating layer 240 after the opening 244 is formed, as shown in FIG. 5.

Figure 6:
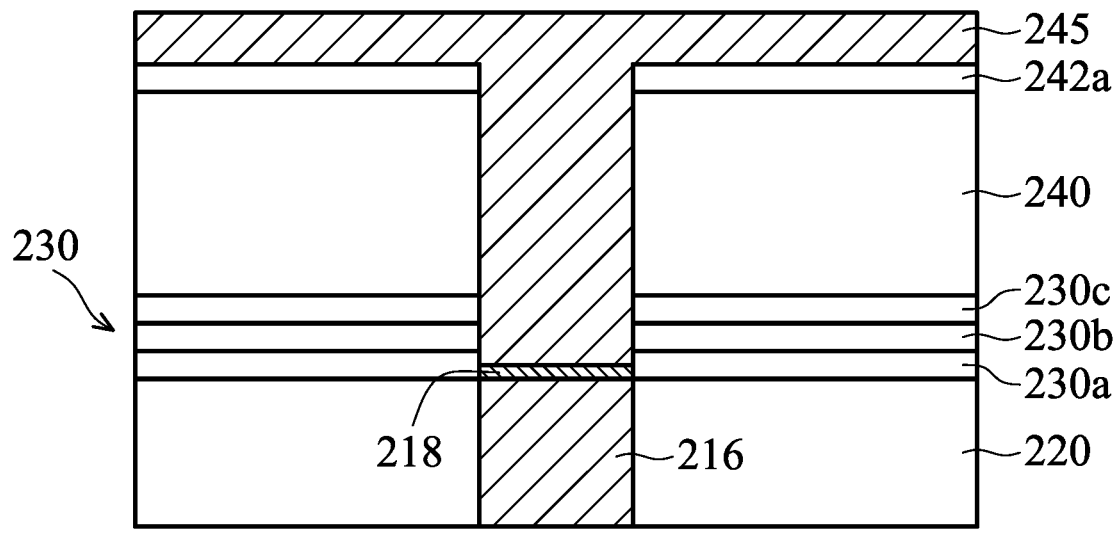

Afterwards, a conductive layer 245 is formed over the patterned masking layer (i.e., the remaining first masking layer 242a) and over the exposed conductive capping layer 218 in the opening 244 (not shown and as indicated in FIG. 5), as shown in FIG. 6 in accordance with some embodiments. In some embodiments, the material and the method that are used for the conductive layer 245 are the same as or similar to those of the via 216 as depicted and described in FIG. 2.

Figure 7:
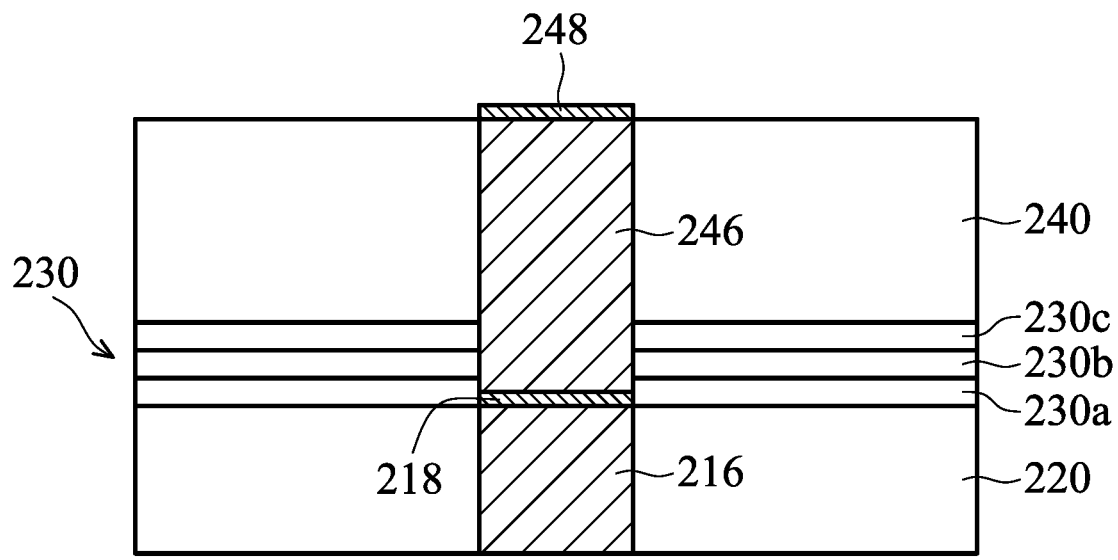

After the conductive layer 245 is formed, a CMP process and/or other planarization process is performed on the conductive layer 245, as shown in FIG. 7 in accordance with some embodiments. The CMP process removes excessive conductive layer 245 and the patterned first masking layer 242a, resulting in a via 246 (which is also referred to as a conductive feature) that includes the remaining conductive layer 245 (which fills the opening 244 shown in FIG. 5). After the CMP process, the insulating layer 240 is exposed and has a top surface that is substantially level with the top surface of the via 246. Afterwards, a conductive capping layer 248 is formed to cover the via 246. In some embodiments, the material and the method that are used for the conductive capping layer 248 are the same as or similar to those of the conductive capping layer 218 as depicted and described in FIG. 2.

Figure 8:
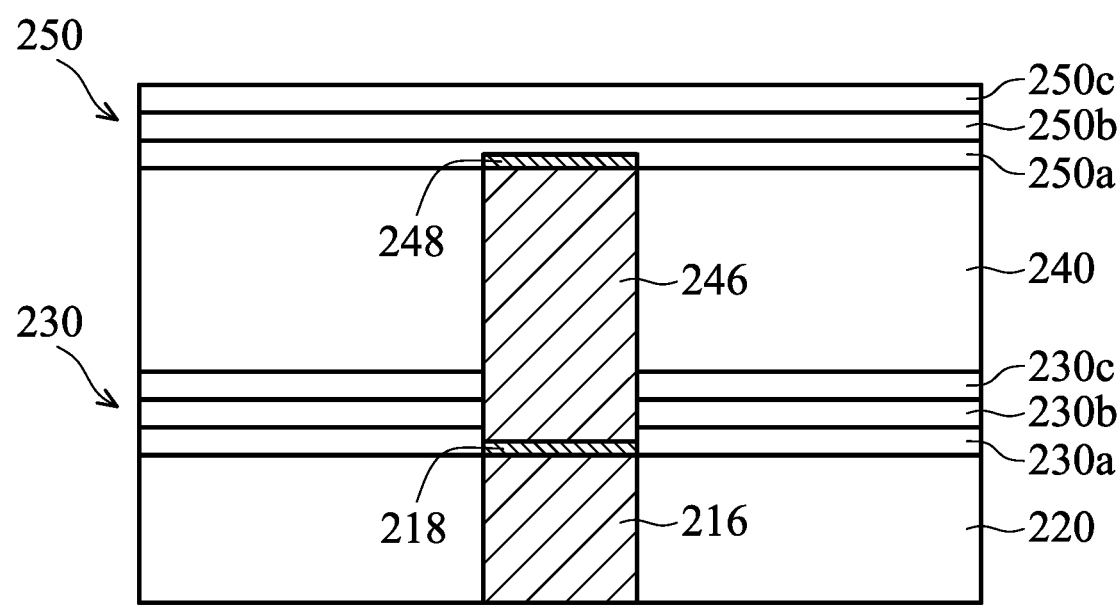

After the conductive capping layer 248 is formed, an etch stop structure 250 is formed over the exposed insulating layer 240 and the conductive capping layer 248, as shown in FIG. 8 in accordance with some embodiments. In some embodiments, the etch stop structure 250 is a multi-layer etch stop structure including a first metal-containing dielectric layer 250a, a silicon-containing dielectric layer 250b, and a second metal-containing dielectric layer 250c. In those cases, the etch stop structure 250 has the same structure as the etch stop structure 230. Therefore, the material and the method that are used for the first metal-containing dielectric layer 250a are the same as or similar to those of the first metal-containing dielectric layer 230a as depicted and described in FIG. 2. Moreover, the material and the method that are used for the silicon-containing dielectric layer 250b are the same as or similar to those of the silicon-containing dielectric layer 230b as depicted and described in FIG. 2. In addition, the material and the method that are used for the second metal-containing dielectric layer 250c are the same as or similar to those of the second metal-containing dielectric layer 230c as depicted and described in FIG. 3.

Embodiments of a semiconductor device structure and a method for forming the same are provided. The semiconductor device structure includes a first metal-containing dielectric layer formed over the insulating layer and covering the top surface of a conductive feature (such as an interconnect structure) in the insulating layer. A silicon-containing dielectric layer is formed over the first metal-containing dielectric layer to prevent the first metal-containing dielectric layer from becoming damaged due to moisture. A second metal-containing dielectric layer having a material that is different from the material of the first metal-containing dielectric layer is formed over the silicon-containing dielectric layer. The first metal-containing dielectric layer, the silicon-containing dielectric layer, and the second metal-containing dielectric layer form a multi-layer etch stop structure to protect the conductive feature (e.g., the copper via) from damage (such as pits and/or hillock) in a reduction gas (e.g., $H_2$ gas) ambient/environment. As a result, damage to the conductive feature can be reduced, thereby increasing the reliability of the interconnect structure, and the yield and performance of the semiconductor device.

In some embodiments, a semiconductor device structure is provided. The structure includes a conductive feature formed in an insulating layer. The structure also includes a first metal-containing dielectric layer formed over the insulating layer and covering a top surface of the conductive feature. The structure further includes a silicon-containing dielectric layer formed over the first metal-containing dielectric layer. In addition, the structure includes a second metal-containing dielectric layer formed over the silicon-containing dielectric layer. The second metal-containing dielectric layer is made of a different material different from a material of the first metal-containing dielectric layer.

In some embodiments, a semiconductor device structure is provided. The structure includes a first multi-layer etch stop structure and an insulating layer formed over the first multi-layer etch stop structure. The structure also includes an interconnect structure formed in the first multi-layer etch stop structure and the insulating layer. In addition, the structure includes a second multi-layer etch stop structure formed over the insulating layer and the interconnect structure. The first multi-layer etch stop structure and the second multi-layer etch stop structure each includes a metal-containing nitride or oxynitride layer and a metal-containing oxide layer over the metal-containing nitride or oxynitride layer.

In some embodiments, a method of forming a semiconductor device structure is provided. The method includes forming a first multi-layer etch stop structure over a first conductive feature and forming an insulating layer over the first multi-layer etch stop structure. The method also includes forming a patterned masking layer over the insulating layer and successively etching the insulating layer and the first multi-layer etch stop structure using the patterned masking layer as an etch mask, so as to form an opening in the insulating layer and the first multi-layer etch stop structure. The method further includes forming a conductive layer over the patterned masking layer and in the opening, and removing a portion of the conductive layer and the patterned masking layer, so that the insulating layer is exposed and a remaining conductive layer in the opening forms a second conductive feature. In addition, the method includes forming a second multi-layer etch stop structure over the exposed insulating layer and the second conductive feature. The formation of the first multi-layer etch stop structure and the second multi-layer etch stop structure each includes forming a first metal-containing dielectric layer, in-situ forming a silicon-containing dielectric layer over the first metal-containing dielectric layer, and forming a second metal-containing dielectric layer over the second metal-containing dielectric layer. The second metal-containing dielectric layer is made of a different material different from a material of the first metal-containing dielectric layer.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a conductive feature formed in an insulating layer;
a first cobalt capping layer covering a bottom surface of the conductive feature, wherein a width of the first cobalt capping layer is substantially equal to a bottom width of the conductive feature, wherein the first cobalt capping layer is a cobalt layer;
a second cobalt capping layer covering a top surface of the conductive feature, wherein the second cobalt capping layer is a cobalt layer;
a first metal-containing dielectric layer formed over the insulating layer and the second cobalt capping layer, wherein a bottom surface of the second cobalt capping layer is coplanar with a bottom surface of the first metal-containing dielectric layer;
a silicon-containing dielectric layer formed over the first metal-containing dielectric layer; and
a second metal-containing dielectric layer formed over the silicon-containing dielectric layer, wherein the second metal-containing dielectric layer comprises a material that is different from a material of the first metal-containing dielectric layer.

2. The semiconductor device structure as claimed in claim 1, wherein the conductive feature comprises a copper layer.

3. The semiconductor device structure as claimed in claim 1, wherein the first metal-containing dielectric layer comprises aluminum, zirconium, or Yttrium.

4. The semiconductor device structure as claimed in claim 1, wherein the first metal-containing dielectric layer is a metal-containing nitride layer.

5. The semiconductor device structure as claimed in claim 4, wherein the silicon-containing dielectric layer is a SiCN layer.

6. The semiconductor device structure as claimed in claim 1, wherein the first metal-containing dielectric layer is a metal-containing oxynitride layer.

7. The semiconductor device structure as claimed in claim 4, wherein the silicon-containing dielectric layer is a SiCO layer.

8. The semiconductor device structure as claimed in claim 1, wherein the second metal-containing dielectric layer is a metal-containing oxide layer.

9. A semiconductor device structure, comprising:
a first multi-layer etch stop structure;
an insulating layer formed over the first multi-layer etch stop structure;
an interconnect structure formed in the first multi-layer etch stop structure and the insulating layer;
a first capping layer covering the interconnect structure;
a second capping layer covered by the interconnect structure and having a bottom surface that is coplanar with a bottom surface of the first multi-layer etch stop structure, wherein each of the first capping layer and the second capping layer is a cobalt layer;
a second multi-layer etch stop structure formed over the insulating layer and the first capping layer and having a bottom surface that is coplanar with a bottom surface of the first capping layer,
wherein the first multi-layer etch stop structure and the second multi-layer etch stop structure each comprises:
a metal-containing nitride or oxynitride layer; and
a metal-containing oxide layer over the metal-containing nitride or oxynitride layer.

10. The semiconductor device structure as claimed in claim 9, wherein the interconnect structure comprises a copper via.

11. The semiconductor device structure as claimed in claim 9, wherein the first multi-layer etch stop structure and the second multi-layer etch stop structure each further comprises a silicon-containing dielectric layer formed between the metal-containing nitride or oxynitride layer and the metal-containing oxide layer.

12. The semiconductor device structure as claimed in claim 11, wherein the silicon-containing dielectric layer is a SiCO layer when the first metal-containing dielectric layer is a metal-containing oxynitride layer.

13. The semiconductor device structure as claimed in claim 11, wherein the silicon-containing dielectric layer is a SiCN layer when the first metal-containing dielectric layer is a metal-containing nitride layer.

14. A semiconductor device structure, comprising:
a first insulating layer;
a first multi-layer etch stop structure formed over the first insulating layer;
a second insulating layer formed over the first multi-layer etch stop structure;
a first conductive feature formed in the first insulating layer;
a first conductive capping layer formed in the first multi-layer etch stop structure and covering a top surface of the first conductive feature, wherein a bottom width of the first conductive capping layer is substantially equal to a top width of the first conductive feature, and a bottom surface of the first conductive capping layer is coplanar with a bottom surface of the first multi-layer etch stop structure; and
a second conductive feature formed in the first multi-layer etch stop structure and the second insulating layer and covering a top surface of the first conductive capping layer, wherein a top width of the first conductive capping layer is substantially equal to a bottom width of the second conductive feature.

15. The semiconductor device structure as claimed in claim 14, further comprising:
a second multi-layer etch stop structure formed over the second insulating layer; and
a second conductive capping layer formed in the second multi-layer etch stop structure and covering a top surface of the second conductive feature.

16. The semiconductor device structure as claimed in claim 15, the first multi-layer etch stop structure and the second multi-layer etch stop structure each comprises:
a first metal-containing dielectric layer;

a silicon-containing dielectric layer formed over the first metal-containing dielectric layer; and second metal-containing dielectric layer formed over the silicon-containing dielectric layer.

17. The semiconductor device structure as claimed in claim 16, wherein the first metal-containing dielectric layer comprises nitrogen, the silicon-containing dielectric layer comprises carbon, and the second metal-containing dielectric layer comprises oxygen.

18. The semiconductor device structure as claimed in claim 1, wherein the second cobalt layer has a top surface that is at a level between the bottom surface of the first metal-containing dielectric layer and a top surface of the first metal-containing dielectric layer.

19. The semiconductor device structure as claimed in claim 9, wherein the second capping layer has a top surface that is lower than a top surface of metal-containing nitride or oxynitride layer of the first multi-layer etch stop structure, and wherein the first capping layer has a top surface that is lower than a top surface of metal-containing nitride or oxynitride layer of the second multi-layer etch stop structure.

20. The semiconductor device structure as claimed in claim 16, wherein an interface between the first conductive capping layer and the second conductive feature is surrounded by the first metal-containing dielectric layer of the first multi-layer etch stop structure.

\* \* \* \* \*